United States Patent [19]

Tokuume

[11] Patent Number: 4,965,722
[45] Date of Patent: Oct. 23, 1990

[54] DYNAMIC MEMORY REFRESH CIRCUIT WITH A FLEXIBLE REFRESH DELAY DYNAMIC MEMORY

[75] Inventor: Takahiro Tokuume, Tokyo, Japan
[73] Assignee: NEC Corporation, Tokyo, Japan
[21] Appl. No.: 441,577
[22] Filed: Nov. 27, 1989

Related U.S. Application Data

[63] Continuation of Ser. No. 228,880, Aug. 5, 1988, Pat. No. 4,924,381, which is a continuation of Ser. No. 743,549, Jun. 11, 1985.

[30] Foreign Application Priority Data

Jun. 11, 1984 [JP] Japan .................... 59-119593
Nov. 15, 1984 [JP] Japan .................... 59-241002

[51] Int. Cl.$^5$ ............................... G06F 1/00
[52] U.S. Cl. ............................ 364/200; 364/246.91; 364/247; 364/258; 364/258.1; 364/244; 364/270; 364/270.2
[58] Field of Search ... 364/200 MS File, 900 MS File; 365/222

[56] References Cited

U.S. PATENT DOCUMENTS 4,535,330 8/1985 Carey et al. .................... 364/900
4,625,301 11/1986 Berger .......................... 365/189.01

Primary Examiner—Gareth D. Shaw
Assistant Examiner—Rebecca L. Rudolph
Attorney, Agent, or Firm—Sughrue, Mion, Zinn, Macpeak & Seas

[57] ABSTRACT

A microprocessor includes an execution unit executing a program according to an instruction, an instruction prefetch circuit storing a plurality of instructions to be executed by the execution unit, a refresh control circuit controlling a refresh operation of a dynamic memory coupled to an external bus and a control unit. The control unit receives bus access request signals from the execution unit and from the instruction prefetch circuit, respectively, and a refresh request signal from the refresh control circuit and sends a refresh grant signal to the refresh control circuit in response to the refresh request signal when both the bus access request signals are absent. The refresh control circuit generates a first refresh request signal and a second refresh request signal. The control unit generates the refresh grant signal in response to the first refresh request signal only when both the bus access request signals from the execution unit and the instruction prefetch circuit are absent, but generates the refresh grant signal at any time the second refresh request signal is generated. The refresh operation is performed at least once and a counter is decremented when the refresh is granted in response to the first refresh request signal and the refresh operation is performed a plurality of times with equivalent decrementing of the counter when the refresh is granted in response to the second refresh request signal.

2 Claims, 4 Drawing Sheets

DYNAMIC MEMORY REFRESH CIRCUIT WITH A FLEXIBLE REFRESH DELAY DYNAMIC MEMORY

This is a continuation of application No. 07/228,880 filed Aug. 5, 1988 now U.S. Pat. No. 4,924,381 which is a continuation of application No. 06/743,549 filed on June 11, 1985.

BACKGROUND OF THE INVENTION

The present invention relates to a microprocessor having a dynamic memory refresh circuit, and particularly to a microprocessor capable of accessing an external dynamic memory in which a refresh operation of stored information is required.

It is well known that information stored in a dynamic memory must be refreshed at predetermined time intervals. In general, a refresh operation is controlled by a refresh controller generating sequential refresh addresses and is performed by means of sense amplifiers coupled to bit lines in a dynamic memory. In the refresh operation, information stored in all memory cells coupled to a word line activated by one refresh address are simultaneously refreshed. Since all information stored in the dynamic memory must be refreshed, a plurality of refresh addresses for activating all word lines are to be generated by the refresh controller. A refresh cycle is predetermined in accordance with a dynamic memory to be used. In a 64 K dynamic memory, for example, 128 refresh addresses are required to active all of the 128 word lines for the refresh operation within normally 2 m sec.

There are other types of memories such as a static memory which does not require refresh operation and a pseudo-static memory which includes a refresh controller and performs a self-refresh operation. However, these memories are expensive. Therefore, dynamic memories having no refresh controller are widely used in a low-cost processing system or in a system with a large memory capacity.

As described above, refresh addresses have to be applied to these dynamic memories from external terminals at the predetermined time intervals. Further, in order to avoid an application of the refresh addresses, a dynamic memory including a counter for generating sequential refresh addresses is provided. In such dynamic memory, however, a timing signal for controlling a count operation according to a predetermined time interval must be applied to the counter from external of the memory.

For the reason described above, a data processing system employing a dynamic memory is provided with a refresh controller to generate refresh addresses and/or a refresh timing signal. The refresh controller is in general provided separately from or independently of a microprocessor having a central processing unit (CPU). However, since both the refresh controller and CPU can not simultaneously access the same memory, the refresh controller must request the CPU to allow a memory access. This request is conventionally done by means of an interruption. In response to reception of the interrupt signal from the refresh controller the CPU sends an access grant signal to the refresh controller when the CPU is not in operation. If the CPU is performing an operation, the access grant signal is not sent to the refresh controller until that operation is finished. When the access grant signal is applied to the refresh controller, the refresh controller starts the refresh operation by using a signal bus to which the dynamic memory, the refresh controller and the CPU are coupled.

It is to be noted that the CPU can not access both the dynamic memory and the bus during the refresh operation. Namely, an operation of the CPU is stopped in the period of the refresh operation. Particularly, even if the operation to be performed by the CPU does not require the dynamic memory access but requires an access to a peripheral equipment, CPU, ROM, or the like which is commonly coupled to the bus, the CPU can not access them because the bus is busy in the refresh operation. Further the CPU has to stop its operation periodically with a time interval to carry out the memory refresh operation. Thus, in the case the operating frequency of the microprocessor is, for instance, 4 MHz, the processing capability of the microprocessor which is stopped by the refresh operation will decrease by about 10% in comparison with that of the microprocessor which does not participate in the refresh operation.

On the other hand there is a microprocessor which involves a refresh control circuit sending a refresh address to a dynamic memory at the predetermined timing in the CPU execution cycle. However, the microprocessor of this type has such shortcomings that a refresh operation can not be performed when the CPU is in a wait condition because in this period the CPU execution cycle is indefinite. Furthermore, in the case a microprocessor includes an instruction prefetch circuit which reads instructions to be executed by a CPU out of an external ROM and preliminarily stores a plurality of the read-out instructions, the signal bus to which the ROM and the dynamic memory are coupled is employed not only by the CPU but also by the instruction prefetch circuit. In general, access to the ROM and the dynamic memory are independently and asynchronously performed. Therefore, the above-mentioned refresh control circuit can not be adapted to the microprocessor including the instruction prefetch circuit.

SUMMARY OF THE PRESENT INVENTION

An object of the present invention is to provide a microprocessor having a refresh control circuit capable of carrying out a dynamic memory refresh operation without reducing the processing capability.

Another object of the present invention is to provide a novel microprocessor which can perform both an instruction prefetch operation and a memory refresh operation.

Still another object of the present invention is to provide a microprocessor in which a memory refresh operation is hindered by a CPU operation and/or an instruction prefetch operation.

Still another object of the present invention is to provide a novel microprocessor in which a CPU, an instruction prefetch circuit and a memory refresh control circuit are integrated on a single semiconductor chip.

Still another object of the present invention is to provide a microprocessor in which a CPU operation and/or an instruction prefetch operation is not hindered by a memory refresh operation.

A microprocessor of the present invention includes a central processing unit (CPU), an instruction prefetch circuit, a bus interface circuit coupling the microprocessor to an external bus through which information transmission is performed between the microprocessor and another microprocessor, a peripheral unit, a dynamic memory, or the like, a memory refresh control circuit and a bus arbiter. The instruction prefetch circuit reads instructions to be executed by the CPU out of an instruction memory (ROM) and preliminarily stores a plurality of the read-out instructions in a prefetch register provided therein. The prefetch register may be constructed by a queue memory. The CPU fetches one instruction stored in the prefetch register in an instruction fetch cycle and executes a data processing according to the instruction. When a data transmission is required in the data processing, the CPU generates a bus access request signal (hereinafter called a first bus access request signal) which is sent to the bus arbiter. On the other hand, the instruction prefetch circuit generates a bus access request signal (hereinafter called a second bus access request signal) when the prefetch register has an empty area storing no instruction. When the bus arbiter receives the first bus access request signal or the second bus access%request signal, it controls the bus interface circuit such that the CPU or the instruction prefetch circuit is coupled to the external bus. When the first and the second bus access request signals are simultaneously received at the bus arbiter, the bus arbiter selects the one having a high priority and grants the external bus usage.

The refresh control circuit sends a refresh request signal to the bus arbiter at predetermined time intervals. The bus arbiter grants to use the external bus for the refresh operation when the first and the second bus access request signals are absent but inhibits the refresh request when at least one of these two bus access request signals is present. Thus, the refresh control circuit performs a refresh operation by use of the external bus only when the refresh request is granted by the bus arbiter.

According to the present invention, a bus access is controlled by the bus arbiter, so that the refresh operation can be performed without exerting a harmful influence upon the CPU operation and the instruction prefetch operation. The refresh control circuit may send a refresh address for activating a word line of a dynamic memory and a refresh control signal indicating a refresh timing to the dynamic memory. However, in the case the dynamic memory includes a timer or a counter for generating refresh addresses or%in the case a refresh address generating circuit is independently provided, the refresh control circuit may generate only the refresh control signal when the refresh request is granted.

In the above-mentioned microprocessor of the present invention, if the first bus access request signal or the second bus access request signal is generated when the refresh operation is being performed, the bus arbiter latches the received bus access request signal until the refresh operation is finished.

This latch operation in the bus arbiter may be avoided by providing a status signal generating circuit in the CPU and/or the instruction prefetch circuit. The status signal generating circuit generates a status signal which indicates that the CPU or the instruction prefetch circuit does not access the external bus during the period of time equal to or longer than the period of a refresh cycle in which a refresh operation of memory cells coupled to at least one word line can be enough performed. This status signal can be obtained by, for example, an instruction decoding. Namely, when the CPU executes an instruction which includes no external bus access, the external bus is in an idle state. If the refresh operation is performed during the period when the CPU executes that instruction, the first bus access request from the CPU will never occur. %Therefore, when an instruction decoder decodes that instruction, CPU may send the status signal to the bus arbiter. The bus arbiter grants the refresh request in the case the refresh request signal is applied thereto from the refresh control circuit only when the status signal is present. On the other hand, the instruction prefetch circuit also can produce the status signal when the prefetch register is storing instructions more than a predetermined number. The bus arbiter grants the refresh request only when these two status signals are both present, if both of the CPU and the instruction prefetch circuit include the status signal generating circuits. This function is very useful in the case that the microprocessor executes a program wherein the external bus access instructions are few.

While, in the case that a program include as many external bus access instructions or many instructions which only require a short period of time to be executed, the first bus access request signal and/or the second bus access request signal is generated many times. As a result, a serious situation that the refresh requests are not granted in a long period of time will occur during the microprocessor executes that program. In order to avoid this situation, a specific circuit may be added to the refresh control circuit. The specific circuit generates a specific refresh request signal when a predetermined number of the refresh requests are rejected by the bus arbiter or the refresh requests are not granted during in a predetermined period of time. The specific refresh request signal is applied to the bus arbiter. Upon receipt of the specific refresh request signal the bus arbiter stops a bus usage of the CPU or the instruction prefetch circuit immediately or after the operation of the CPU or the prefetch circuit is finished. Thus, the refresh operation can be smoothly performed without destroying the information stored in the dynamic memory.

DETAILED DESCRIPTION OF THE EMBODIMENTS

Figure 1:
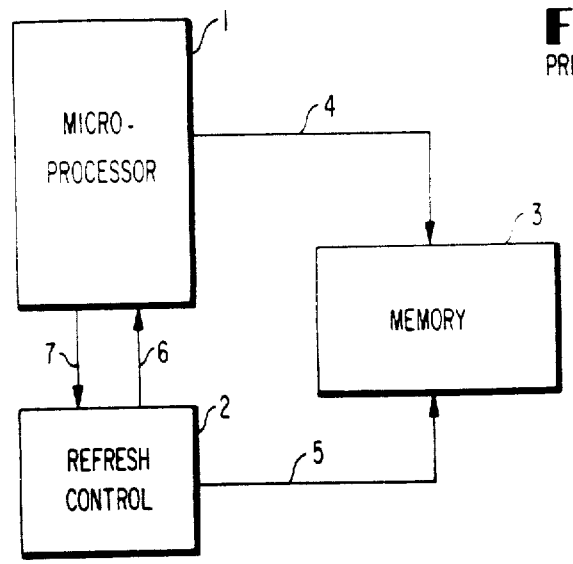
FIG. 1 is a block diagram of a conventional microprocessor.

In a conventional microprocessor system, the memory refresh operation has been realized by a logic circuit (hereinafter called the "refresh controller") provided outside the microprocessor. FIG. 1 shows the construction of a conventional microprocessor system including a microprocessor 1, a refresh controller 2, a dynamic memory 3, a memory access signal 4, a memory refresh signal 5, a memory refresh request signal 6, a memory refresh grant signal 7. In the case of FIG. 1, the following procedure is employed to execute the refresh operation:

(1) The refresh controller 2 sends the memory refresh request signal 6 to the microprocessor 1 at constant time intervals;

(2) On receiving the memory refresh request signal 6, the microprocessor 1 stops its operation immediately after completing the present operation and sends the refresh grant signal 7 to the refresh controller 2;

(3) On receiving the refresh grant signal 7, the refresh controller 2 applies the refresh control signal 5 to the memory 3 to execute the refresh operation;

(4) The refresh controller 2 stops sending the refresh request signal 6 to the microprocessor after completing the refresh operation, thereby reporting the completion of the refresh operation;

(5) Upon confirmation of the termination of the refresh operation, the microprocessor 1 cuts the refresh grant signal 7 and restarts the processing; and (6) The operations from (1) through (5) are repeated.

A disadvantage of such a conventional microprocessor is that the processing capability thereof tends to decrease because the microprocessor has to stop its operation at certain time intervals to carry out the memory refresh operation. In case the operating frequency of the microprocessor is, for instance, 4 MHz, the processing capability of the microprocessor will decrease by about 10%.

Figure 2:
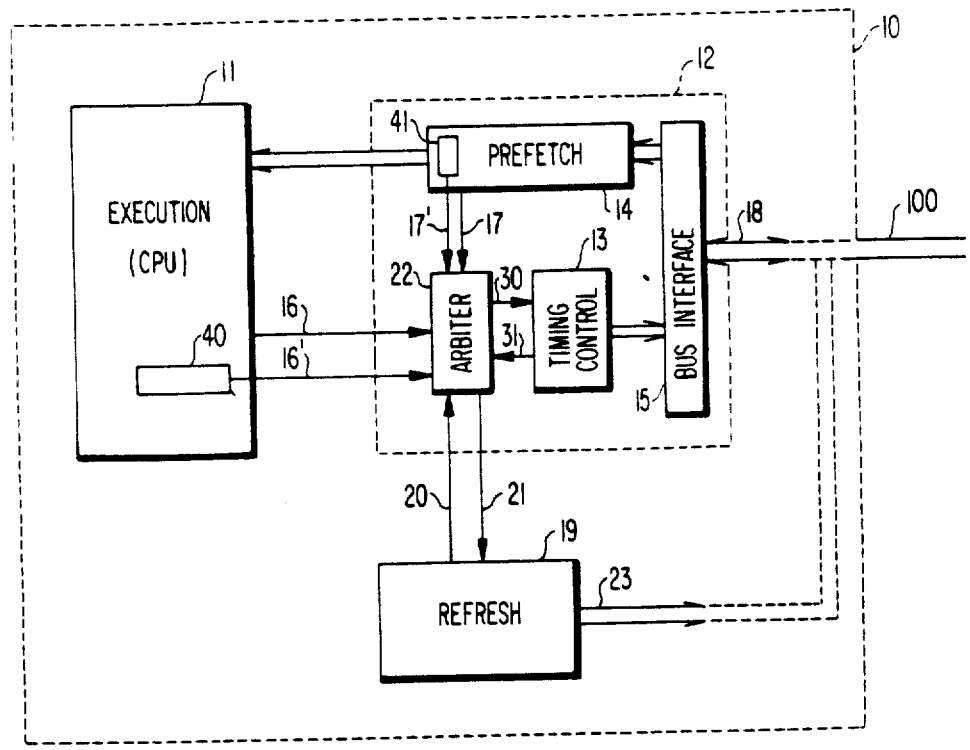
FIG. 2 is a block diagram of a microprocessor according to an embodiment of the present invention.

Referring now to FIG. 2, a microprocessor 10 embodying the present invention comprises an execution unit (CPU) 11, a bus interface control unit 12, and a refresh control circuit 19, which are integrated on a single semiconductor chip 10. The bs interface control unit 12 includes a timing control circuit 13, an instruction prefetch circuit 14, a bus interface circuit 15, and a bus arbiter 22, which receives a first bus access request signal 16 from the CPU 11, a second bus access request signal 17 from the prefetch circuit 14, and a refresh request signal 20 from the refresh control circuit 19 and sends a refresh grant signal 21 to the refresh control circuit 19. The bus interface circuit generates an access signal 18 to an outside dynamic memory (not shown) or input/output unit (not shown) provided outside the microprocessor 10. The access signal 18 includes a data, an address and a control information and is transferred through an external bus 100 to a peripheral unit, another microprocessor, a program memory, a dynamic memory (DRAM), and the like (not shown), which are coupled in common to the external bus 100. A refresh control signal 23 is generated by the refresh control circuit 19 and transferred to the outside dynamic memory through the bus 100. Instead the refresh control signal 23 may be transferred to the bus 100 via the bus interface circuit 15 or may be transferred to the memory by using another bus (not shown) separate from the bus 100.

The basic operation of the microprocessor 10 of FIG. 2 will be described first.

The instruction prefetch circuit 14 is used to read an instruction from the external program memory (ROM) and stores the read-out instruction in a que register therein. The queue register cam store several instructions at a time. In case there is still a space for storage, it will produce the second bus access request signal 17 to start the access to the ROM for storing an instruction to be executed by the CPU 11.

The CPU 11 executes the instruction which has been stored in the prefetch circuit 14. As the instruction is processed, it will produce the first bus access request signal 16 if access to the outside dynamic memory, input/output unit or the like is required. On receiving the bus access request signal 16 or 17 from the CPU 11 or the instruction prefetch circuit 14, the timing control circuit 13 operates to control the bus interface circuit 15 to couple the CPU or the circuit 14 to the external bus 100.

The memory refresh operation will subsequently be described.

(1) The refresh control circuit 19 sends the refresh request signal 20 to the bus arbiter 22 at constant time intervals.

(2) The bus arbiter 22 operates to adjust the bus access request signals 16, 17 and 20 respectively applied from the CPU 11, the prefetch circuit 14 and the refresh control circuit 19.

(3) When the bus access request signal is applied from the CPU 11 or the prefetch circuit 14, the bus arbiter 22 holds the refresh request signal 20 and controls the timing control circuit 13 to allow the bus access requested by the CPU 11 or the prefetch circuit 14.

(4) If the bus access request signal is not applied from the CPU 11 or the prefetch circuit 14, the refresh request signal 20 is accepted and the refresh grant signal 21 is sent to the refresh control circuit 19.

(5) On receiving the refresh grant signal 21, the refresh control circuit 19 operates to apply the refresh control signal 23 to the external dynamic memory and execute the refresh operation.

As set forth above, the bus arbiter 22 according to the embodiment is used to detect that the access to the external bus has not been gained to implement the memory refresh operation.

The refresh control circuit 19 and the bus arbiter 22 will be described in detail.

Figure 3:
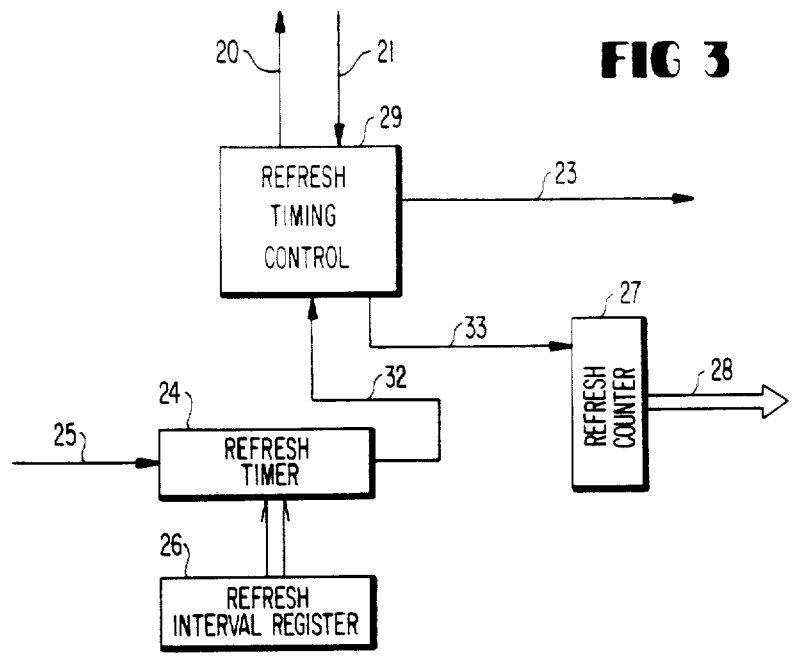
FIG. 3 is a block diagram illustrating the structure of a refresh control circuit employed for the embodiment of the present invention of FIG. 2.

FIG. 3 shows the refresh control circuit 19 comprising a refresh timer 24 receiving a clock pulse 25, a refresh interval set register 26, a refresh counter 27 generating refresh address 28, and a refresh timing control circuit 29 generating the refresh request signal 20, receiving the refresh grant signal 21 and generating the refresh control command 33.

Referring to FIG. 3, the operation of the refresh control circuit will be described.

The refresh timer 24 receiving the clock pulse 25 as an input clock generates a timing signal 32 and sends it to the refresh timing control circuit 29 at constant time intervals. The time interval of the refresh timer 24 is given by the refresh interval set register 26. The refresh counter 27 produces the refresh address 28 and increments the contents thereof to "1" or "2" each time it executes the refresh operation in response to a control signal 33.

When the refresh timing control circuit 29 receives the timing signal 32 from the refresh timer 24, it produces the refresh request signal 20. On receiving the refresh grant signal 23, it produces the refresh control command 23 to designate a refresh timing to a dynamic memory to be refreshed. The circuit 29 further produces the control signal 33 for incrementing the counter 27.

Figure 4:
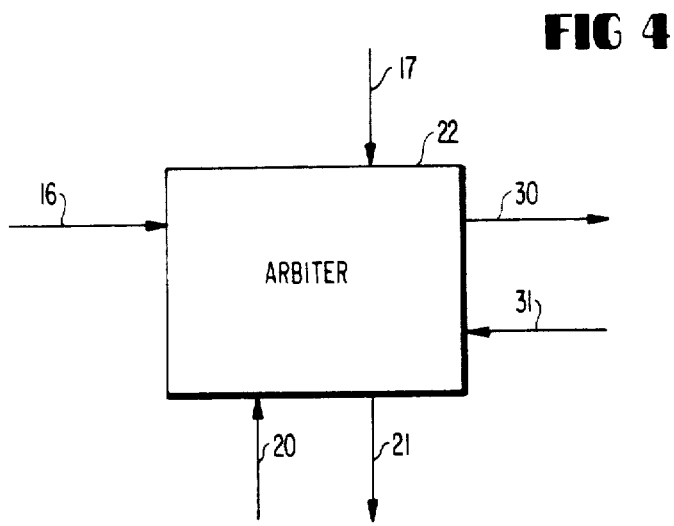
FIGS. 4 and 5 are block diagrams illustrating the bus arbiters of FIG. 2.
Figure 5:
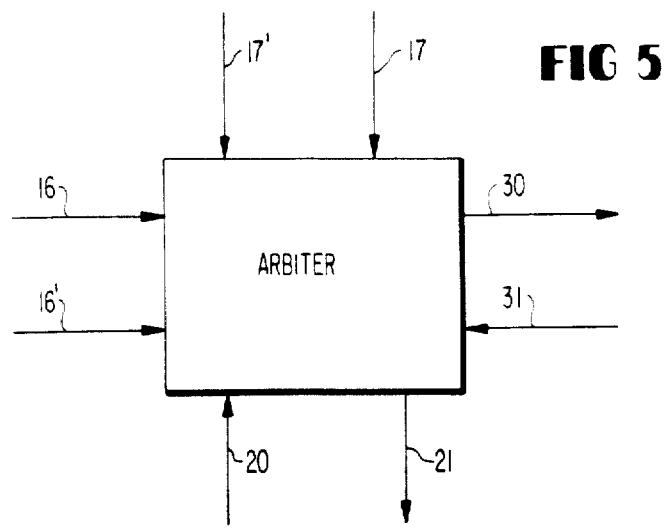

FIGS. 4 and 5 show the bus arbiter 22 receiving the first bus access request signal 16, the second bus access request signal 17, a first status signal 16', a second status signal 17', the refresh request signal 20 and a bus access termination signal 31 and generating the refresh grant signal 21, a bus access start signal 30.

Referring to FIG. 4, the operation thereof will be described first.

The first bus access request signal 16 and the second bus access request signal 17 are sent out respectively whenever the bus access must be executed in the CPU 11 and the instruction prefetch circuit 14. These signals are effective when the bus access termination signal 31 is applied from the timing control circuit, or when the external bus 100 is in an idle status. The bus arbiter 22 will hold the refresh request signal 20 and send the bus access start signal 30 to the timing control circuit to effect the bus access operation of the CPU and the prefetch circuit.

If both the first bus access request signal 16 and the second bus access request signal 17 are absent, the bus arbiter 22 will accept the refresh request signal 20 and send the refresh grant signal 21 to the refresh control circuit 19 to implement the refresh operation. The bus arbiter 22 may be constructed by a random logic circuit, a decoding circuit (e.g. programmable logic array (PLA)), or the like, which determines an output status according to the combination of the inputted signals.

According to the above-described embodiment, the refresh operation can be performed without exerting harmful influence on the CPU operation and the prefetch operation. Further, the refresh operation can be performed even if the CPU 11 is in a waiting condition or a hold condition. Furthermore, the instruction prefetch circuit 14 can be integrated in the semiconductor chip 10 with the CPU 11. The CPU 11 can also execute an instruction read out of the prefetch circuit 14 without taking account of the refresh operation.

While the refresh operation is being executed, the bus arbiter 22 has to hold the bus access request signals from the CPU 11 and the prefetch circuit 14. Namely, a latch circuit is required in the bus arbiter 22.

FIG. 5 shows another embodiment of the bus arbiter in which the latch circuit can be omitted from the bus arbiter. The difference from the bus arbiter of FIG. 4 lies in the conditions under which the refresh operation is permitted. This point only will be described. A first status signal 16' and a second status signal 17' are respectively applied to the bus arbiter 22. They become effective when the CPU and the prefetch circuit do not generate the bus access signals during a period from the present over several clocks (time enough to execute the refresh operation). The bus arbiter 22 will accept the refresh request in case both the first bus access request signal 16 and the second bus access request signal 17 are absent and both the status signals 16' and 17' are present.

As the result, the bus access request signals are not applied to the bus arbiter 22 during the time refresh operation is performed. Therefore, the above-described latch circuit can be omitted. The first status signal 16' can be produced by decoding an instruction which is sent to the CPU. That is, if the instruction to be executed needs to access the external bus, the first status signal 16' is not generated, while the first status signal 16' is generated when the CPU 11 executes an instruction which requires external bus access. This first status signal 16' can be produced by implementing a first detecting circuit 40 as shown in FIG. 2 detecting the instruction which includes no external bus access.

On the other hand, the second status signal 17' is produced by a second detecting circuit 41 which is to be provided in the prefetch circuit 14 as shown in FIG. 2.

The second detecting circuit 41 detects that the prefetch circuit 14 is storing full instructions or that the circuit 14 is storing instructions more than a predetermined number and generates the second status signal 17'.

As described above, the microprocessor of the present invention can smoothly perform the refresh operation. Particularly, the refresh operation can be performed in parallel with the CPU operation with no bus access.

Figure 6:
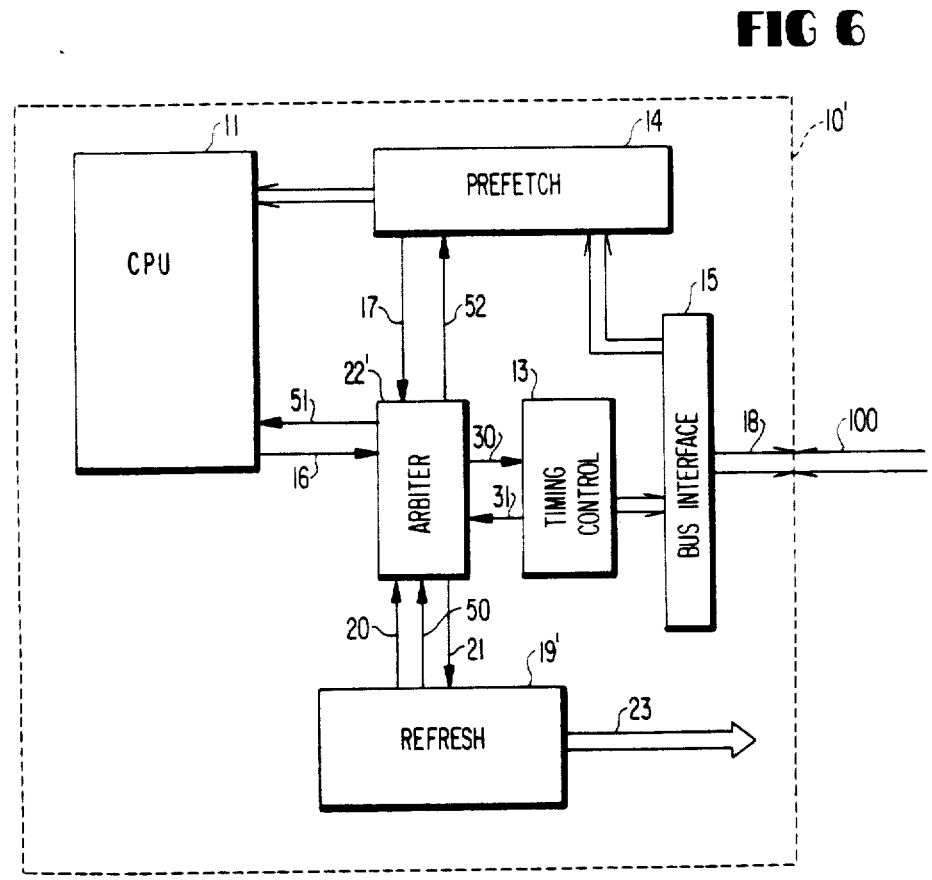
FIG. 6 is a block diagram of a microprocessor according to another embodiment of the present invention.

Referring now to FIG. 6, a microprocessor 10' according to another embodiment of the present invention comprises a CPU 11, a timing control circuit 13, an instruction prefetch circuit 14, a bus interface circuit 15 generating an access signal 18 to an outside dynamic memory, outside input/output unit or the like coupled to an external bus 100, a refresh control circuit 19' generating a refresh request signal 20, a specific refresh request signal 50 and a refresh control signal 23, and a bus arbiter 22' receiving a first bus access request signal 16 and a second bus access request signal 17.

The basic operation of the microprocess of FIG. 6 is as follows:

The instruction prefetch circuit 14 generates the second bus access request signal 17 and sends it to the bus arbiter 22' in the case that a queue register (not shown) provided in the prefetch circuit 14 has at least one empty area or has a plurality of empty areas more than a predetermined number of areas. Upon receipt of the second bus access request signal 17 the bus arbiter 22' sends an acknowledgement signal 52 to the prefetch circuit 14 when the external bus 100 is in an idle state. On the other hand, the CPU 11 fetches an instruction to be executed from the prefetch circuit 14 and decodes the instruction in a decoder (not shown). According to the decoding the CPU executes a processing. When the processing is being executed, the CPU sends the first bus access request signal 16 to the bus arbiter 22' at an arbitrary timing if the external bus access is required. The bus arbiter 22' receives this signal 16 and returns an acknowledgement signal 51 to the CPU 11 when the external bus 100 is in an idle state. When the bus arbiter 22' receives the bus access signal 16 or 17, a bus access start signal 30 is applied to the timing control circuit 13. The timing control circuit 13 controls the bus interface circuit 15 such that the external bus 100 is coupled to the CPU 11 or the prefetch circuit 14.

The memory refresh operation will now be described. In the case of FIG. 6, there are two kinds of the refresh request signals; namely, the normal refresh request signal 20 and the specific refresh request signal 50 produced from the refresh control circuit 19'. The refresh operation according to the normal request signal 20 will be explained first:

(1) The refresh control circuit 19' sends the normal refresh request signal 20 to the bus arbiter 22' at constant time intervals (e.g. 16 microseconds).

(2) The bus arbiter 22' operates to adjust the signals 16, 17 and 20 respectively applied from the CPU 11, the prefetch circuit 14 and the refresh control circuit 19'.

(3) If the bus access request signal 16 or 17 is applied from the CPU 11 or the prefetch circuit 14, the normal refresh request signal 20 is not accepted.

(4) If the bus access request signals 16 and 17 are absent the normal refresh request signal 20 is accepted and the refresh grant signal 21 is sent to the refresh control circuit 19'.

(5) On receiving the refresh grant signal 21, the refresh control circuit 19' operates to apply the refresh control signal 23 to the external dynamic memory in which execution of the refresh operation is thereby initiated.

(6) The refresh control circuit 19' stops sending the normal refresh request signal 20 to the bus arbiter 22' when the refresh operation is finished, thereby reporting the termination of the refresh operation, whereas the bus arbiter 22' cuts the refresh grant signal 21.

(7) The bus arbiter 22' holds the bus access request signals 16 and 17 applied by the CPU and the prefetch circuit when the refresh operation grant signal 21 is active.

As set forth above, because the refresh operation is executed by detecting that the microprocessor is not operating to gain access to the external bus 100, it is possible to provide the memory refresh operation by minimizing reduction in the processing capability of the microprocessor.

In case the microprocessor is caused to continuously execute the bus access operation for a long time, the above operation will not allow the memory refresh operation to be executed for a long period of time and thereby the information stored in the dynamic memory will be destroyed. As a way to counter such situation, the memory refresh operation is allowed by using the specific refresh request signal 50. The memory refresh operation by means of the specific refresh request signal 50 is as follows:

(1) In the refresh control circuit 19', the normal refresh request signal 20 is produced at an interval of, for example, 16 microseconds and, in case this normal refresh request signal 20 is not accepted 8 times, that is, the refresh operation is not executed for a period of 128 microseconds, the specific refresh request signal 50 is produced.

(2) On receiving the specific refresh request signal 50, the bus arbiter 22' forces the bus access request signals 16 and 17 given by the CPU11 and the prefetch circuit 14 to be held and sends the refresh grant signal 21 to the refresh control circuit 19'

(3) On receiving the refresh grant signal 21, the refresh control circuit 19' applies the refresh control signal 23 to the external memory to execute the memory refresh operation.

(4) The refresh control circuit 19' operates to repeat the memory refresh operation continuously eight times before terminating it and thereafter cuts off the specific refresh request signal 50 to inform the bus arbiter 22' of that fact and then the bus arbiter 22' cuts off the refresh grant signal 21.

As set forth above, as the refresh operation by means of the specific refresh request signal 50 is carried out by interrupting into the CPU operation and the prefetch operation. In other words, the priority order on the bus access will be the specific refresh request signal 50 (highest), the bus access request signals 16 and 17 (second highest), and the normal refresh request signal 20 (lowest).

The refresh control circuit 19' and the bus arbiter 22' will be described in detail.

Figure 7:
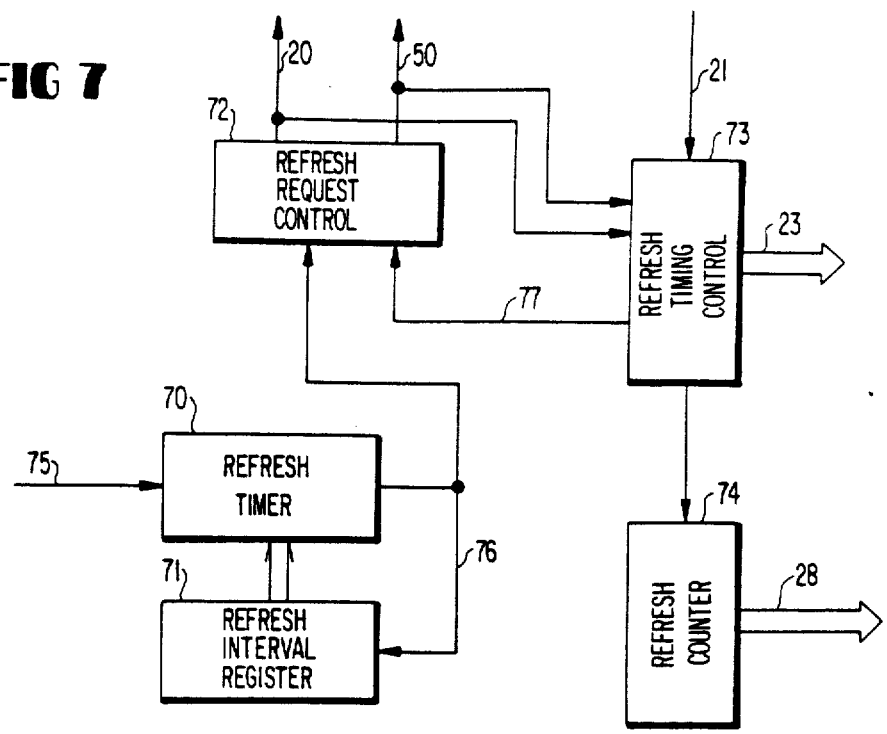
FIG. 7 is a block diagram illustrating the structure of the refresh control circuit of FIG. 6.

FIG. 7 shows the refresh control circuit 19' comprising a refresh timer 70, receiving a clock signal 75, a refresh interval set register 71, a refresh counter 74 generating a refresh address 28, a refresh timing control circuit 73 receiving the refresh grant signal 21 and generating the refresh control signal 23, and a refresh request control circuit 72 generating the normal refresh request signal 20 and the specific refresh request signal 50.

The operation of the refresh control circuit of FIG. 7 is as follows. The refresh timer 70 is a timer counting the clock signal 75 and sends a refresh timing signal 76 to the refresh request control circuit 72 at constant time intervals (the time is determined by the value set at the refresh interval set register 71). The refresh request control circuit 72 contains an up/down counter, which is counted up by the refresh timing signal 76 from the refresh timer 70 and counted down in response to a signal 77 generated each time the refresh operation is executed. The refresh request signals are produced from the refresh request control circuit 72. That is, the normal refresh request signal 20 is produced when the content of the counter indicates "1", whereas the specific refresh request signal 50 is produced when the contents of the counter in the refresh request control circuit 72 indicates "8".

Moreover, the refresh counter 74 stores a refresh address and the content thereof is incremented each time the refresh operation is executed once.

The refresh timing control circuit 73 is used to control the execution of the refresh operation and, on receiving the refresh operation grant signal 21, executes the refresh operation as many times as required depending on the conditions of the refresh request signal. In other words, when the normal refresh request signal 20 only is effective, it executes the refresh operation once and, when the specific refresh request signal 50 is effective, the required number of times (for instance 8 times). The refresh operation timing control circuit 73 instructs the refresh counter 74 to output the refresh address 28 during the refresh operation and also applies the refresh control signal 23 to the external memory. In addition, the refresh timing control circuit 73 increments the content of the refresh counter 74 and decrements the counter of the refresh request control circuit 72 at the end of one refresh operation.

Figure 8:
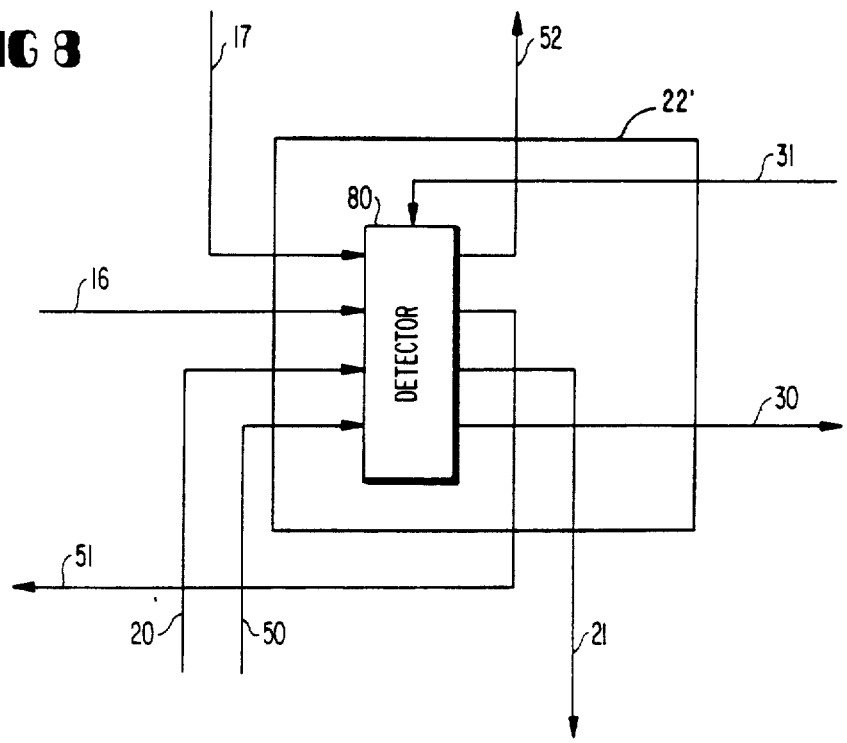
FIG. 8 is a block diagram illustrating the bus arbiter of FIG. 6.

FIG. 8 shows the bus arbiter 22' having a detection circuit 80 which receives the first bus access request signal 16, the second bus access request signal 17, the normal refresh request signal 20, the specific refresh request signal 50 and generates the acknowledgement signal 51 to the CPU, the acknowledgement signal 52 to the prefetch circuit and the refresh grant signal 21. The detection circuit 80 further generates the bus access start signal 30 and receives the bus access termination signal 31.

Referring to FIG. 8, the operation of the bus arbiter 22' will be described.

The following four kinds of bus access request signals are applied to the bus arbiter:
  the first bus access request signal 16 sent from the CPU 11;
  the second bus access request signal 17 sent from the instruction prefetch circuit 14;
  the normal refresh request signal 20 sent from the refresh control circuit 19'; and
  the specific refresh request signal 50 sent from the refresh control circuit 19'.

Among these four bus access request signals, there is the following priority order as previously referred to:
  the specific refresh request signal $50 \leq$ the first bus access request signal $16 \leq$ the second bus access request signal $17 \leq$ the normal refresh request signal 20, whereby the bus arbiter 22' operates to accept a signal of the highest priority order among the signals applied thereto. That is, the bus arbiter examines the four kinds of the bus access request signals using the detection circuit 80 when the bus access termination signal 31 is sent from the timing control circuit 13 and applies the permissive signal (the acknowledgement signals 51, 52 and the refresh grant signal 21) to what has the highest priority and generates the bus access start signal 30 to the timing control circuit 13.

According to the microprocessor shown in FIG. 6, the refresh operation is performed in response to the normal refresh request signal 20 when frequency in the external bus access of the CPU 11 and the instruction prefetch circuit 14 is low. While if the program with high frequency in the external bus access is performed by the microprocessor, the refresh operation can be performed with certainty by the specific refresh request signal 50. Therefore, the microprocessor can perform the program processing without reducing the processing capability thereof and can also perform the refresh operation independent on the program processing.

Further, the present invention can be adapted to a microprocessor having no instruction prefetch circuit. In this case the second bus access request signal is not required. Furthermore, the microprocessor can be also adapted to a dynamic memory having a refresh address generator. In this case the refresh control circuit does not need the refresh address counter and may generate a refresh timing control signal only, according to the control of the bus arbiter. Moreover, the present invention is useful in a microprocessor in which operations of a CPU and an instruction prefetch circuit are performed asynchronously with each other.

What is claimed is:

1. A microprocessor coupled to a dynamic memory via an external bus, comprising an execution unit executing an instruction and generating a bus request signal to access said external bus when a data transmission is required in the execution of the instruction, a refresh timer for generating a refresh timing signal at predetermined time intervals, first means coupled to said refresh timer for generating a first refresh request signal in response to said refresh timing signal, second means coupled to said external bus for executing a refresh operation for said dynamic memory in response to a refresh grant signal supplied thereto, third means coupled to said second means for generating a refresh operation execution signal each time one refresh operation for said dynamic memory is executed, a counter coupled to said refresh timer and said third means for counting up a value thereof each time said refresh timing signal is generated and counting down the value thereof each time said refresh operation execution signal is generated, fourth means coupled to said counter for generating a second refresh request signal when the count value of said counter reaches a predetermined value, and a bus arbiter coupled to said execution unit and said first and fourth means for receiving said bus request signal and said first and second refresh request signals, said bus arbiter disregarding said first refresh request signal when said bus request signal is supplied thereto, accepting said first refresh request signal when said bus request signal is absent to generate and supply said refresh grant signal to said second means, and responding to said second refresh request signal to generate and supply said refresh grant signal to said second means irrespective of the presence of said bus request signal, said second means performing said refresh operation for said dynamic memory at least once when said refresh grant signal is generated in response to said first refresh request signal and performing said refresh operation for said dynamic memory a plurality of times when said refresh grant signal is generated in response to said second refresh request signal.

2. A microprocessor coupled via an external bus to a dynamic memory, comprising an instruction prefetch unit temporarily storing at least one instruction and generating a first bus request signal to access said external bus when an instruction to be prefetched is required, an execution unit executing an instruction from said instruction prefetch unit and generating a second bus request signal to access said external bus when a data transmission is required in the execution of the instruction, a bus arbiter coupled to said instruction prefetch unit and said execution unit for receiving said first and second bus request signals, said bus arbiter accepting said second bus request signal irrespective of the presence of said first bus request signal to allow a bus access for said data transmission and accepting said first bus request signal when said second bus request signal is absent to allow a bus access for the instruction prefetch, a refresh timer for generating a refresh timing signal at predetermined time intervals, first means coupled to said refresh timer for generating a first refresh request signal in response to said refresh timing signal, second means coupled to said external bus for executing a refresh operation for said dynamic memory in response to a refresh grant signal supplied thereto, third means coupled to said second means for generating a refresh operation execution signal each time one refresh operation for said dynamic memory is executed, a counter coupled to said refresh timer and said third means for counting up a value thereof each time said refresh timing signal is generated and counting down the value thereof each time said refresh operation execution signal is generated, and fourth means coupled to said counter for generating a second refresh request signal when the count value of said counter reaches a predetermined value, said bus arbiter being further coupled to said first and fourth means to receive said first and second refresh request signals, said bus arbiter disregarding said first refresh request signal when at least one of said first and second bus request signals are supplied thereto, accepting said first refresh request signal when both of said first and second bus request signals are absent to generate and supply said refresh grant signal to said second means, and responding to said second refresh request signal to generate and supply said refresh grant signal to said second means irrespective of the presence of both of said first and second bus request signals, said second means performing said refresh operation for said dynamic memory at least once when said refresh grant signal is generated in response to said first refresh request signal and performing said refresh operation for said dynamic memory a plurality of times when said refresh grant signal is generated in response to said second refresh request signal.

* * * * *

UNITED STATES PATENT AND TRADEMARK OFFICE
CERTIFICATE OF CORRECTION

PATENT NO. : 4,965,722

DATED : October 23, 1990

INVENTOR(S) : Takahiro TOKUUME

It is certified that error appears in the above-identified patent and that said Letters Patent is hereby corrected as shown below:

Title page:

Title: after "DELAY" delete "DYNAMIC MEMORY";

Col. 3, line 19, delete "%";

Col. 3, line 45, delete "%";

Col. 4, line 2, delete "%";

Col. 5, line 34, delete "bs" and insert --bus--;

Col. 5, line 63, delete "que" and insert --queue--;

Col. 5, line 64, delete "cam" and insert --can--;

Col. 10, line 65, delete "50$\leq$ " and insert --50 > --;

Col. 10, line 66, delete "16$\leq$ " and insert --16>--;

Col. 10, line 67, delete "17$\leq$" and insert --17>--.

Signed and Sealed this

Twenty-ninth Day of September, 1992

Attest:

DOUGLAS B. COMER

Attesting Officer

Acting Commissioner of Patents and Trademarks